US008117571B1

(12) United States Patent
Chauhan et al.

(10) Patent No.: US 8,117,571 B1
(45) Date of Patent: Feb. 14, 2012

(54) SYSTEM, METHOD, AND COMPUTER PROGRAM PRODUCT FOR DETERMINING EQUIVALENCE OF NETLISTS UTILIZING ABSTRACTIONS AND TRANSFORMATIONS

(75) Inventors: Pankaj P. Chauhan, San Jose, CA (US); Deepak Goyal, Sunnyvale, CA (US); Anmol Mathur, San Jose, CA (US)

(73) Assignee: Calypto Design Systems, Inc., Santa Clara, CA (US)

( * ) Notice: Subject to any disclaimer, the term of this patent is extended or adjusted under 35 U.S.C. 154(b) by 393 days.

(21) Appl. No.: 12/260,851

(22) Filed: Oct. 29, 2008

(51) Int. Cl.
*G06F 17/50* (2006.01)
(52) U.S. Cl. .................. 716/104; 716/111; 716/136
(58) Field of Classification Search .................. 716/104, 716/111, 136
See application file for complete search history.

(56) References Cited

U.S. PATENT DOCUMENTS

| 7,222,317 B1 | 5/2007 | Mathur et al. ............ 716/5 |
| 2003/0074644 A1* | 4/2003 | Mandell et al. ............ 716/7 |

OTHER PUBLICATIONS

U.S. Appl. No. 12/260,837, filed Oct. 29, 2008.

* cited by examiner

*Primary Examiner* — Thuan Do
(74) *Attorney, Agent, or Firm* — Klarquist Sparkman, LLP

(57) ABSTRACT

A system, method and computer program product are provided for determining equivalence of netlists utilizing at least one transformation. In use, a netlist including a plurality of infinite portions and a plurality of finite portions is identified. Additionally, at least some of the finite portions are transformed, utilizing at least one predetermined transformation. Further, an equivalence of the netlist and another netlist is determined, utilizing at least a subset of the finite portions and the infinite portions. Moreover, an abstraction is performed on the netlist.

27 Claims, 3 Drawing Sheets

SYSTEM, METHOD, AND COMPUTER PROGRAM PRODUCT FOR DETERMINING EQUIVALENCE OF NETLISTS UTILIZING ABSTRACTIONS AND TRANSFORMATIONS

FIELD OF THE INVENTION

The present invention relates to netlists, and more particularly to determining netlist equivalencies.

BACKGROUND

Netlist equivalencies have traditionally been determined for various purposes. For example, techniques for determining an equivalency of a proposed netlist and a netlist previously determined to be valid have oftentimes been utilized for validating the proposed netlist. Thus, validation of circuits associated with netlists has been performed utilizing traditional netlist equivalency techniques. Generally, traditional netlist equivalency techniques have included apportioning each of the proposed netlist and valid netlist into a plurality of word-level portions and determining whether such word-level portions match.

However, traditional techniques for determining netlist equivalencies have generally exhibited various limitations. Just by way of example, traditional netlist equivalency techniques have customarily relied on simulation to show equivalency without formally proving such equivalency, have been limited to only performing bit-level comparisons, etc. There is thus a need for addressing these and/or other issues associated with the prior art.

SUMMARY

A system, method and computer program product are provided for determining equivalence of netlists utilizing at least one transformation. In use, a netlist including a plurality of infinite portions and a plurality of finite portions is identified. Additionally, at least some of the finite portions are transformed into infinite portions, utilizing at least one predetermined transformation. Further, an equivalence of the netlist and another netlist is determined, utilizing at least a subset of the finite portions and the infinite portions. Moreover, an abstraction is performed on the netlist.

DETAILED DESCRIPTION

Figure 1:
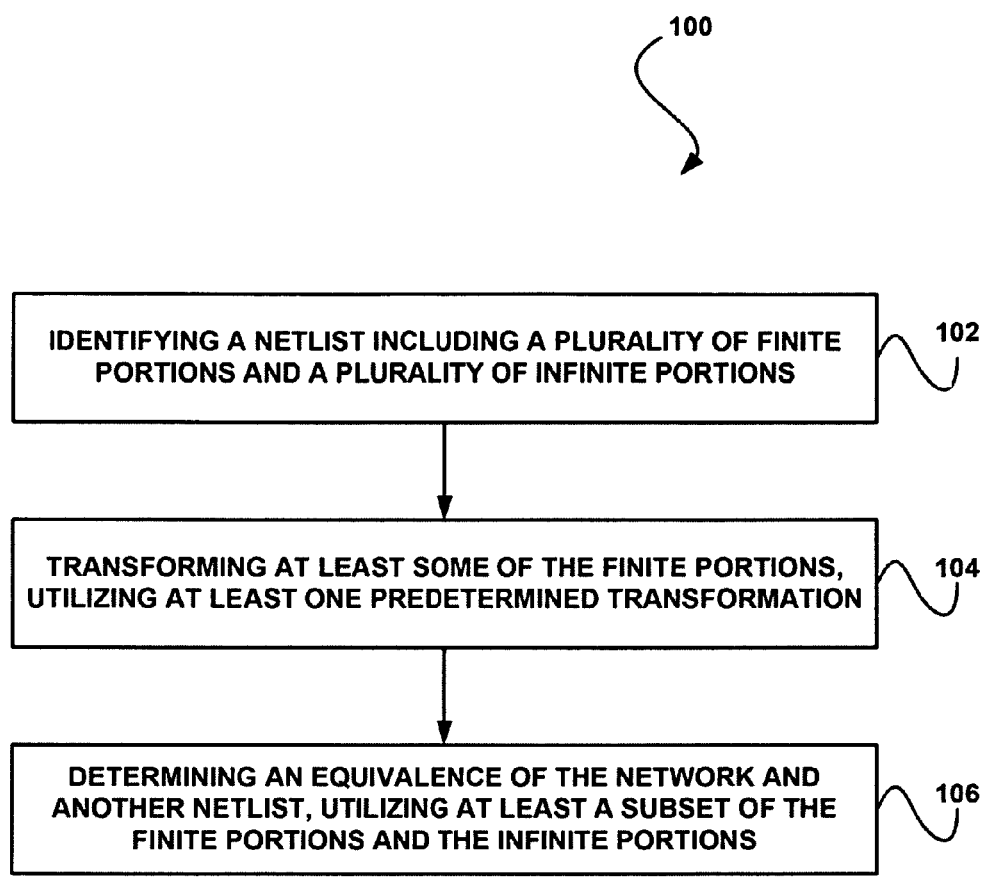
FIG. 1 shows a method for determining equivalence of netlists utilizing at least one transformation, in accordance with one embodiment.

FIG. 1 shows a method for determining equivalence of netlists utilizing at least one transformation, in accordance with one embodiment. As shown in operation 102, a netlist including a plurality of finite portions and a plurality of infinite portions is identified. In the context of the present description, the netlist may include connectivity information associated with an electrical design (e.g. a circuit, a chip, etc.). For example, nets in the netlist may be representative of the connections of the electrical design. In various embodiments, the netlist may be word-level, bit-level, etc. Further, the netlist may include a combinational netlist, such that an equivalence of combinational netlists may be determined, as described in more detail below with respect to operation 106.

Additionally, with respect to the present description, the finite portions of the netlist may include portions (e.g. regions, etc.) of the netlist that may be reasoned in finite precision. For example, finite precision arithmetic may be utilized determining an equivalence of the finite portions with other finite portions. In one embodiment, the finite portions may include lossy regions of the netlist. In another embodiment, the finite portions may include at least one finite operator. In yet another embodiment, the bit width of the finite portions may be utilized in determining the equivalence of the finite portions with other finite portions.

Also with respect to the present description, the infinite portions of the netlist may include portions (e.g. regions, etc.) of the netlist that may be reasoned in infinite precision. As an option, unbounded integers may be utilized for determining an equivalence of the infinite portions with other infinite portions. Such infinite portions may include, in one embodiment, lossless regions of the netlist. In another embodiment, the infinite portions may include at least one infinite operator. In yet another embodiment, the bit width of the infinite portions may be ignored in determining the equivalence of the infinite portions with other infinite portions. In still yet another embodiment, the finite portions may optionally be treated e.g. as real numbers, or unbounded integers, etc. In one embodiment, the infinite portions may be solved utilizing Applications of Satisfiability Testing (SAT) Module Theory (SMT). One example of such an SMT solver is Cooperating Validity Checker (CVC).

U.S. Pat. No. 7,222,317, issued May 22, 2007 and entitled "Circuit Comparison By Information Loss Matching," which is hereby incorporated by reference, discloses examples of the finite portions and infinite portions that may be included in the netlist. Further, the netlist including the finite portions and the infinite portions may be identified in any desired manner. In one embodiment, the netlist may be input. In another embodiment, the netlist may be input (e.g. by a user, etc.) for validation of a correctness of the netlist.

As also shown, at least some of the finite portions are transformed, utilizing at least one predetermined transformation. Note operation 104. With respect to the present embodiment, the transformation may include any transform of at least some of the finite portions that identifies a word-level functionality of the at least some of the finite portions by converting bit-level functionality into word-level functionality. For example, the transformation may include transforming at least some of the finite portions into infinite portions (e.g. from a finite portion type to an infinite portion type). The transformation may be utilized for reducing the number of finite portions of the netlist.

In addition, the predetermined transformation may include any transformation predetermined to transform a finite portion of a netlist (e.g. into an infinite portion of a netlist, for example, while preserving a functionality of the finite portion) that identifies a word-level functionality of the at least some of the finite portions by converting bit-level functionality into word-level functionality. Appendices A and B illustrate various examples of transformations that may be applied to at least some of the finite portions of the netlist for transforming such finite portions (e.g. to infinite portions).

To this end, the transformation of some of the finite portions may identify a word-level functionality of such finite portions by converting a bit-level functionality of such finite portions to the word-level functionality. For example, the finite portions may be transformed from a bit-level structure to a word-level structure. In this way, the finite portions may be converted to a word-level structure, via the transformation.

Just by way of example, the transformation may include a concatenation of two words, which may also be expressed as a multiplication by a second power and addition. The concatenation may inherently be a finite operation. However, the multiplication and addition may not be a finite operation.

In another embodiment, the transformation of some of the finite portions may normalize such finite portions. The normalization may include any conversion of the finite portions into a standard format. Just by way of example, the transformation may normalize the finite portions by changing the finite portions to uniformly be signed. Of course, however, the transformation may also normalize the finite portions by changing the finite portions to uniformly be unsigned.

As another option, the normalization may include converting the finite portions to common word-level definitions. Just by way of example, the transformation may include ordering a finite operator (e.g. a bit select) and an infinite operator. The ordering may be such that the finite operator is as close to primary inputs of the infinite operator as possible.

In yet another embodiment, the transformation may reduce a number of bits allocated to an operator, based on information content at various points in the netlist. The information content may indicate a minimal number of bits utilized at each of the various points in the netlist, for example. Such operator may include a finite operator of at least one of the finite portions. To this end, a width of the operator may be reduced via the transformation.

As an option, the number of bits may be reduced, based on information content and/or required precision of the netlist at various points in the netlist. The required precision may be predetermined, for example. Additionally, the content of the netlist may include a number of bits utilized as input to the operator for which the number of bits may be reduced.

The information content and/or required precision of the netlist may be identified utilizing interval arithmetic. For example, a number of bits utilized for input to the operator may be analyzed for determining an upper bound and a lower bound for such number. Furthermore, an extent to which the number of bits allocated may be reduced may optionally be determined, utilizing the lower bound. The interval arithmetic may optionally be utilized for optimizing the finite portions of the netlist transformed into the infinite portions of the netlist.

Still yet, as shown in operation 106, an equivalence of the netlist and another netlist is determined, utilizing at least a subset of the finite portions and the infinite portions. With respect to the present description, the other netlist may include any netlist other than the netlist for which at least some of the finite portions are transformed. For example, the other netlist may include a netlist predetermined to be valid. As another example, the other netlist may include a combinational netlist, such that an equivalence of combinational netlists may be determined.

In one embodiment, the equivalence may be determined via a comparison of the netlist and the other netlist. For example, the comparison may include comparing at least a subset of the finite portions of the netlist with finite portions of the other netlist and infinite portions of the netlist with infinite portions of the other netlist. Such finite portions of the netlist may exclude the transformed finite portions of the netlist (e.g. the finite portions transformed into the infinite portions).

If the finite portions of the netlist compared with the finite portions of the other netlist match and the infinite portions of the netlist compared with the infinite portions of the other netlist match, it may be determined that the netlist is equivalent to the other netlist. In this way, it may be determined that the netlist is equivalent to the other netlist, and that furthermore the netlist is valid, as an option. If, however, the finite portions of the netlist compared with the finite portions of the other netlist do not match and the infinite portions of the netlist compared with the infinite portions of the other netlist do not match, it may be determined that it is unknown whether the netlist is equivalent to the other netlist. To this end, at least one predetermined transformation may be utilized for determining an equivalence of netlists.

In another optional embodiment, a netlist including a plurality of infinite portions and a plurality of finite portions may be identified. Additionally, at least some of the finite portions may be transformed, utilizing at least one predetermined transformation. Furthermore, an equivalence of the netlist and another netlist may be determined, utilizing at least a subset of the finite portions and the infinite portions. Still yet, an abstraction on the netlist may be performed. Such abstraction may be conditionally performed based on the determination as to whether the netlist is equivalent to the other netlist, for example. As another example, the abstraction may include replacing hard arithmetic operators.

More illustrative information will now be set forth regarding various optional architectures and features with which the foregoing technique may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
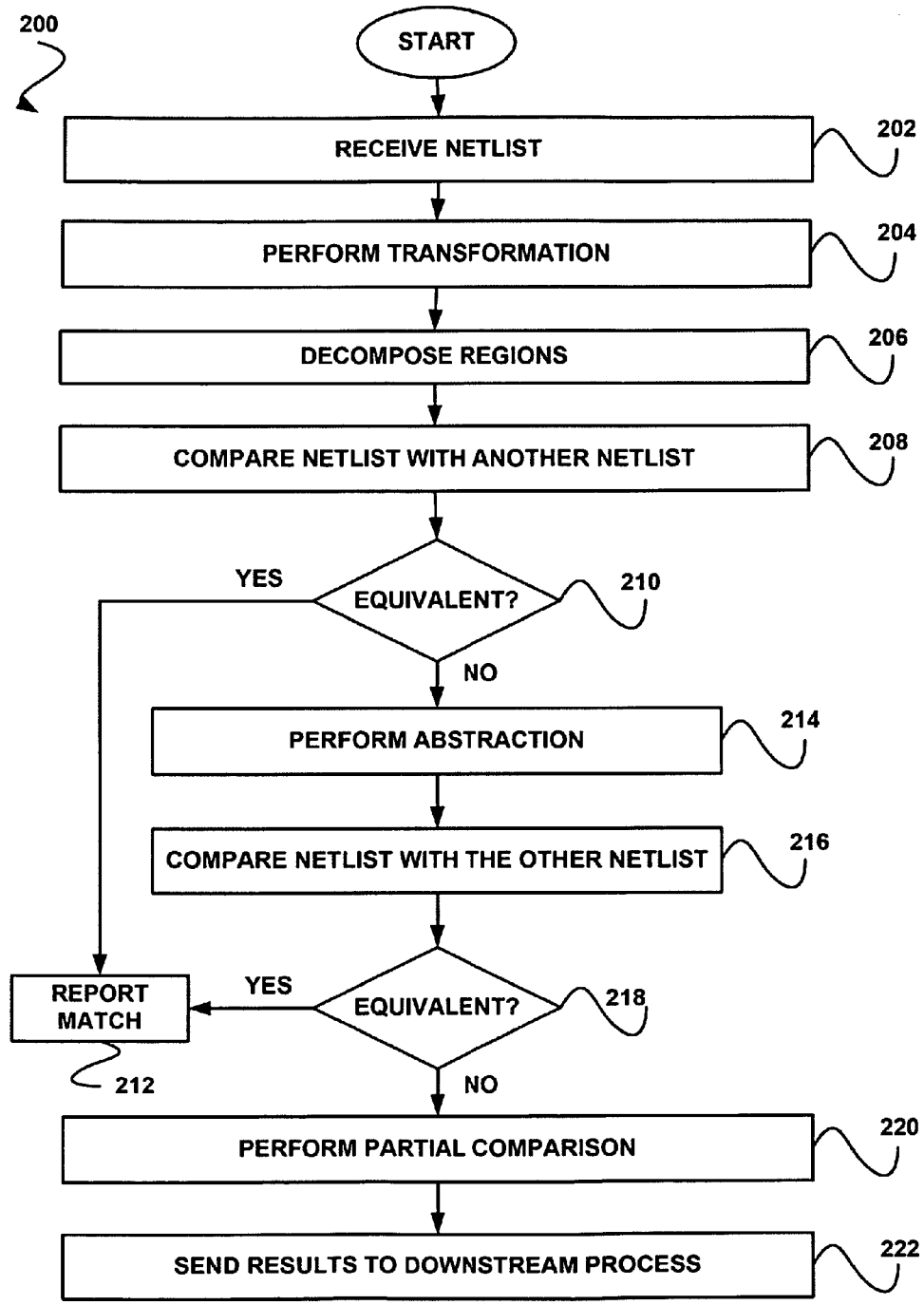
FIG. 2 shows a method for determining an equivalence of an abstraction of netlists if an equivalence of the netlists utilizing transformations is not identified, in accordance with another embodiment.

FIG. 2 shows a method 200 for determining an equivalence of an abstraction of netlists if an equivalence of the netlists utilizing transformations is not identified, in accordance with another embodiment. As an option, the method 200 may be carried out in the context of the details of FIG. 1. Of course, however, the method 200 may be carried out in any desired environment. Further, the aforementioned definitions may equally apply to the description below.

As shown in operation 202, a netlist is received. The netlist may be received in response to input by a user, in one embodiment. In another embodiment, the netlist may be received in response to creation of the netlist. As an option, the netlist may be received for validating a functionality of the netlist.

Additionally, a transformation is performed on the netlist, as shown in operation 204. With respect to the present embodiment, the transformation may include transforming at least some finite portions of the netlist into infinite portions of the netlist utilizing at least one predetermined transformation. For example, the transformation may be performed utilizing a catalog of predefined transformations.

Table 1 shows one exemplary iteration loop that utilizes predetermined transformations for performing the transformation on the netlist. Of course, it should be noted that such iteration loop is set forth for illustrative purposes only, and thus should not be construed as limiting in any manner.

TABLE 1

WLX-pre →
(Const. Prop. → WLX-loop → (StrRedux → RPIC-- → CSE)$^\omega$ →
WLX-post → RPIC ConstNorm → RPIC SignNorm Tables 2-4 show various examples of transformations that may be utilized with respect to the iteration loop of Table 1. While Verilog hardware description language (HDL) is used for providing descriptions of at least some of the transformations in Tables 2-4, it should be noted that such language is utilized for exemplary purposes only, and thus should not be construed as limiting in any manner. Further, with respect to Tables 2-4, the values 'n' and 'm' denote the widths of word-level signals, such that bit index n−1 and m−1 denote the most significant bit positions. As shown in Table 1, at least one preprocessing transformation (WLX-pre) is performed on the netlist. For example, a subset of preprocessing transformations may be selected from a plurality of available preprocessing transformations for performing such selected subset of preprocessing transformations on the netlist. Table 2 shows examples of various preprocessing transformations. Again, it should be noted that such preprocessing transformations are set forth for illustrative purposes only, and thus should not be construed as limiting in any manner.

TABLE 2

| Transform | Brief Description |
|---|---|
| COMPBSEL | Signed comparison in the 2s complement notation is sometimes implemented using only unsigned comparison. For example, ((unsigned) x <= (unsigned) y) EXOR X[n−1] EXOR y[m−1] can be transformed to simply ((signed) x <= (signed) y). Here, n−1 and m−1 denote the indices of the most significant bits of x and y respectively. |
| POW2CMP | Comparisons with powers of 2 are sometimes rewritten using some bit-level operators, and they are transformed back to powers of 2 comparisons. As an example, !x[n−1] && (!x[n−2:m]) can simply be transformed to x > $2^m$. |
| 2SCOMPEXTEND | Sometimes, sign extension of x is written as (x[n−1] ? x−2**n : x). This is transformed simply to sign extension of x. |
| CONSTMUX | (bit ? 1..10..0 : 0..0) is transformed to {bit, .., bit, 0, .., 0}. *Note: MUX = multiplexer |
| SNEXTN2 | Let b be [m−1:0] signed, and a be [n−1:0] unsigned, m > n, and let tmp be [n−1:0] signed. Then, b = (a < 0)?{<(m−n) 1s>, a}:a is transformed to sign extension of a, i.e., tmp = a; b = tmp. |
| REVBSEL3 | During the transformation loop, convert x < 0 to x[n−1] and (x >= 0) to !x[n−1]. In the transformation loop, bit-select is preferred, since other transformations can simplify the bit-selects. This transformation eventually is reversed by the post loop transformation BSEL3 to reveal the word-level intent (comparison with 0). |
| REDXN | Kill reduction operators to allow word-level reasoning for the reduction operators. For example, (|x) is transformed to (x != 0), etc., as shown below. Just to refresh the Verilog operators, | is reduction OR, & is reduction AND, ~ is bitwise inversion, and ! is logical not. In the list below, → means that the expression on the left is transformed to the expression on the right. 1. !|a → a==0 2. |a → a!=0 3. !&(~a) → a!=0 4. &(~a) → a==0 5. &c → c===−1 6. !&c → c!==−1 7. &a → (signed) a == −1 8. !&a → (signed) a != −1 9. |(~c) → c!=−1 10. !|(~c) → c==−1 11. |(~a) → (signed) a != −1 12. !|(~a) → (signed) a == −1 13. ~a → −1−a |

TABLE 2-continued

| Transform | Brief Description |
|---|---|
| BLST10 | y = −(x[n−1]); {y,x} is transformed to sign extension of x. |

As also shown in Table 1, a constant propagation (Const. Prop) is performed. The constant propagation may include performing any desired number of transformations on the netlist. Further, the constant propagation may be performed in a loop (WLX-loop), as shown. For example, the constant propagation may be repeated in the loop until stability is achieved.

Table 3 shows examples of various transformations that may be performed during the constant propagation. It should be noted that such constant propagation transformations are set forth for illustrative purposes only, and thus should not be construed as limiting in any manner.

TABLE 3

| Transform | Brief Description |
|---|---|
| BCAT1 | If only one signal is being concatenated, drop the concatenation {a} → a *Note BCAT = bit concatenation |
| BSEL1 | If bit select signal selects all bits of a signal, then drop the bit select signal a[n−1:0] → a |
| REXNCAT | Merge bitwise and/or O1. Let A = &a, or A=a where a is 1 bit. Similarly define B. Then A && B is transformed to &{a,b} O2. Let A = &a, or A=a where a is 1 bit. Similarly define B. Then A & B is transformed to &{a,b} O3. Let A = |a, or A=a where a is 1 bit. Similarly define B. Then A || B is transformed to |{a,b} O4. Let A = |a, or A=a where a is 1 bit. Similarly define B. Then A | B transformed to |{a,b} |
| BSEL4 | If the information content (IC) of an unsigned signal x is n-bits, and we have a bit-select a[m], where m > n, then a[m] is transformed to 0. |
| RELOP | Based on the information contents (IC) of the one or more inputs to various relational operators, we can simplify the operations. As an example, consider the expression a > b. Suppose that interval arithmetic based IC analysis concludes that the range of a is [$a_l$, $a_h$] and for b it is [$b_l$, $b_h$]. If $a_l$ > $b_h$, then a > b is transformed to constant 1. Similarly, if $a_h$ <= $b_l$ then a > b is transformed to constant 0. This transform relies on interval arithmetic based information content analysis. |
| ORZERO | Synthesis tools like to use bitwise OR operations to effect essentially a bit concatenation. This transforms reverses that effect. To be precise, if the lower n bits of a signal x[m−1:0] are zero, and the information content of a signal y is n-bits or less, then x|y is transformed to {x, y[n−1:0]}. |
| BCAT3 | Explicit zero extension done by concatenating 0s is dropped, and instead, an unsigned extension is inserted, i.e., y = {0, x} is transformed to y = (unsigned) x. |

TABLE 3-continued

| Transform | Brief Description |
|---|---|
| BCAT10 | Explicit sign extension by repeating most significant bit in a bit concatenation is transformed to a simple sign extension, i.e., for x[n−1:0], {x[n−1], x[n−1], . . . , x} is transformed to sign-extension of x. |
| LOSSYEXTN | The idea behind this complex transformation is that even if there is a loss of 1 bit at the output of an operator (say add, multiply, etc.), if we already know what that lost bit is, and that bit is explicitly concatenated later on, there really isn't a loss. So we update the types of the output and input edges such that there is no loss, get rid of the bit-concatenation, and that the IC propagation remains the same as before. In more details, a: n bits, signed or unsigned b: in bits, signed or unsigned c: n+m bits, signed or unsigned c': n+m bits, signed a = OP(in1, in2, . . . ) (output of some operator), b = −1, c = {b, a}, and the IC range at the output of OP is n+1 bits or less signed, and all negative → in1' = f1(in1), in2' = f2(in2), . . . , c' = OP(in1', in2', . . . ), c = c', provided the IC range at the output of OP is n+1 bits or less signed, and all negative Thus, we want to transform OP such that the BCAT is gone, and that the original IC propagation is preserved. For example, if z = x + y, then after transforming the output of x+y to n+1 bits from n bits, you might change the IC propagation at the inputs of + if the inputs x and y are unsigned, and the ICs flowing through are all negative. In order to preserve the IC propagation, you'll need to modify the inputs to be signed. For unit required precision (RP) operator (the RP at the inputs is equal to the RP at the output), then for each input of OP such that the source IC on the input is the same width or less than the input width, but is of different sign, then typecast the input to match the IC sign and width, and then connect to the OP. Currently, unit RP operators are Add, Sub, USub, Mult, And, Or, Inv, Xor, Xnor, Nand, Nor, TypeConv and Mux. The transformation can be generalized to non-unit RP operators, but for now, we'll only deal with unit RP operators. |
| BSELMASK | To mask certain bits from a signal, a bitwise-and with a constant containing zeroes is encountered. This is transformed to bit-select, and left shift, e.g., if x is 7-bits wide, (a & 0011000) is transformed to (a[4:3]) << 3. |
| REVBSEL3 | Described in Table 2. |
| RSFT | Since bit-select is the canonical form for transforms within the iterative loop, we transform right shifts to corresponding bit-selects, e.g., for a[n−1:0], a >> m is transformed to a[n−1:m]. |
| BCATINV | In a concatenation of signals, if a 1-bit signal is found inverted, it is converted to concatenation without inversion, and $2^m$ is added, where m is the bit-position of the 1-bit inverted signal in the concatenation, i.e., {a, ~b, c} is transformed to temp = {b, c}+$2^m$; {a, temp}. |
| PUSHLSFT | As a normalizing transformation, we move all the left shifts towards the outputs of certain operators, such as add, subtract, multiply, relational operators, etc. The rules of the transformation are S1. (a << m) RELOP 0 → a RELOP 0, where RELOP is any of ==, !=, <, >, <= and >=, making a signed, if necessary. S2. (a << m) * b → (a * b) << m. S3. (a << m)−−(TC)−− → a −− (TC)−−(<< m)−− (might need another TC between a and TC.) S4. −(a << m) → (−a) << m S5. ((a << m) << n) → a << (m+n) S6/L2. ((a << m) >> n)) → a << (m−n) (if m > n) a (if m == n) a >> (n−m) (otherwise) S7. ((a << m1) BOP (b << m2)) → ((a << (m1−m)) BOP (b << (m2−m))) << m, where m is min(m1, m2), and BOP is one of the operators: +, −, &, |, ^&, ^|. Care is taken to properly interpret various typecast inherent in the operators. *Note: TC = type conversion |
| PUSHBCAT | Similar to PUSHLSFT above, where we push binary bit-concatenations towards the output of various operators. |
| LSFT | Just as bit-selects are a canonical form during the loop, bit-concatenations are too. So we transform all left shift operators to corresponding bit-concats, i.e., (x << n) is transformed to {x, n zeroes}, and (x<<m)+y is transformed to {x,y}, where y is m bits wide. |
| MERGEBCAT | Nested bit-concatenation operators are flattened into a single wide bit-concatenation, e.g., {a, {b, c}} is transformed to {a, b, c}. |
| BCAT5 | If adjacent signals in a bit-concat are adjacent bit-selects of the same signal, we can merge those two bit-selected signals. For example, { . . . , a[8:5],a[4:3], . . . } is transformed to {...,a[8:3],...}. Many a times, this gets rid of bit-select and bit-concatenation complete, for example, {x[15:8], x[7:0]} gets transformed to {x[15:0]}, and if x is 16-bits wide, this gets simplified to just x, using BCAT1, and BSEL1 transformations listed above. |
| BCATOP | To reduce binary arithmetic operator bit-widths, when lower few bits of some input to arithmetic operators is zero, bit-selects, and bit-concatenations, in addition to the operator, are used. This transformation reverts such word-level unfriendly regions to |

TABLE 3-continued

| Transform | Brief Description |
|---|---|
|  | word-level friendly operators. As an example, {x[n−1:2]+y, x[1:0]} can be transformed to {x[n−1:2], x[1:0]} + {y, 2'h0}. Repeated application of BCATOP and BCAT5 can greatly simplify and make word-level friendly many netlists. The transformation is defined for arithmetic operators +, −, and bitwise operators AND, OR, XOR, XNOR. To properly pair up the appropriate branch of the operator, a limited non-local lookup in the fanin of the operator is performed to find matching, adjacent bit-selects. |
| BSEL2 | A pair of bit-selects is simplified to a single bit-select. In the transformation loop, it is applied only if the leading bit-select loses at least one bit from the least significant position. |
| BCATFT | bit-concatenation followed by a bit-select is simplified appropriately. For example, let w = {x, y, z}, where x, y and z are each 8-bits wide, and w is 24-bits wide. Then w[15:8] is transformed to y. |
| TMUX | A pair of back to back 2-input multiplexers with identical or inverted select signals are simplified to just one appropriate multiplexer. For example, 1. (a == 1) ? $e_1$: (a == 0) ? $e_0$: (irrelevant) is transformed to a ? $e_1$: $e_0$ 2. (a == 0) ? $e_0$: (a == 1) ? $e_1$: (irrelevant) is transformed to a ? $e_1$: $e_0$ There can be type-converts from a to 32 bit (for comparison with 0/1). Moreover, instead of a == 0 and a == 1, we may encounter a and !a. |
| EQZ | Equality comparisons with zero are pushed towards the inputs of certain operators, such as bit-selects, type converts, bit-wise ORs. The precise set of rules are Notations: a,b: n bit unsigned inputs x: [n−1:0] bit $x_s$: [n−1:0] bit signed $x_u$: [n−1:0] bit unsigned y: n−m bit unsigned 1. (a \| b) == 0 → (a==0) && (b==0) 2. (a \| b) != 0 → (a!=0) \|\| (b!=0) 3. a−(TC)−(==0) → a==0 provided the IC at the input of TC is less than the width of the outgoing edge. 4. a−(TC)−(!=0) → a!=0 provided the IC at the input of TC is less than the width of the outgoing edge. 2u. y = $x_u$ [n−1:m]; y == 0 → $x_u$ <= $2^m$ −1 if m > 0, $x_u$ == 0 otherwise 2s. y = $x_s$ [n−1:m]; y == 0 → ($x_s$ <= $2^m$ −1) && ($x_s$ >= 0) if m >0, $x_s$ == 0 otherwise 3u. y = $x_u$ [n−1:m]; y != 0 → $x_u$ > $2^m$ −1 if (m >0), $x_u$!= 0 otherwise 3s. y = $x_s$ [n−1:m]; y != 0 → ($x_s$ > $2^m$ −1) \|\| ($x_s$ < 0) if (m > 0), $x_s$!= 0 otherwise |

TABLE 3-continued

| Transform | Brief Description |
|---|---|
| EQNEGONE | Similar to EQZ above, where we push equality with −1 (all 1s in 2s complement notation) towards the input of various operators, such as type converts, bit-selects, bit-wise ANDs. For example, (a AND b == −1) is transformed to (a == −1) AND (b == −1). |
| CPROP | This the classical constant propagation on word-level netlists. a very simple example is a+0 being transformed to a. |
| RPIC | Required precision and information content analysis (RPIC) for reducing the widths of operators Required precision: if the number of bits in the output (determined using the information content analysis) is less than the width of the netlist, only compute a subset of the netlist (e.g. reduce the number of bits based on the number of bits in the output) Information content analysis: determines the minimal number of bits used at each point in the netlist RPIC analysis and pruning without sign and constant normalization |
| STR | Strength reduction Replace a complex operator (e.g. a multiplier) with a less complex operator (e.g. left shift). |
| CSE | Common Subexpression Elimination (structural hashing) Eliminate two sub expressions of a single expression that are structurally equivalent |

As further shown in Table 1, at least one post-processing transformation (WLX-post) is performed on the netlist. For example, a subset of post-processing transformations may be selected from a plurality of available post-processing transformations for performing such selected subset of post-processing transformations on the netlist. Table 4 shows examples of various post-processing transformations. Again, it should be noted that such post-processing transformations are set forth for illustrative purposes only, and thus should not be construed as limiting in any manner.

TABLE 4

| Transform | Detailed Description |
|---|---|
| BSEL3 | Replace selection of most significant bit of a signal with an interpretation of the signal as less than zero when signed a[msb] → (signed)a<0 |
| BCAT4 | Replaces the concatenation of 2 signals by shifting a first signal by a number of bits in the second signal added to the second signal {a,b} → a<<\|b\|+b |
| SignNorm | RPIC based Sign Normalization Normalize as many signed signals in the netlist into unsigned signals as possible |
| ConstNorm | RPIC based Constant Normalization Replace constants in the netlist with smaller constants while maintaining functionality of the netlist (e.g. reduce the value 255 to −1) |

Performing the transformation on the netlist may allow the netlist to be simplified. For example, the transformation may reduce a width of each operator in the netlist, may reduce a size of the netlist, etc. As another example, the transformation may extract a word-level intent of the netlist, thus optionally providing a maximum number of possible infinite portions of the netlist.

Further, regions of the netlist are decomposed, as shown in operation 206. The regions may include a finite region and an infinite region. For example, the finite region may include finite portions of the netlist, whereas the infinite region may include infinite portions of the netlist.

Thus, decomposing the regions may optionally include identifying portions of netlist associated with each of the regions. Such decomposition may be utilized for separating the finite portions of the netlist from the infinite portions of the netlist. In one embodiment, the decomposition may be performed by analyzing operators included in the netlist (e.g. determining whether the operators include finite operators associated with a finite portion of the netlist or infinite operators associated with an infinite portion of the netlist).

As an option, the decomposition may be affected by the signedness of primary inputs of operators included in the netlist (e.g. whether the operators utilized signed inputs or unsigned inputs). The inputs may be of any desired sign, such that each combination of signs of the inputs may result in a different decomposition. Thus, a combination of signs, each sign associated with a different input for an operator, that is capable of generating an equality between the netlist and another netlist may be determined. As yet another option, word-level input associated with an operator may be decomposed into a plurality of smaller words based on the bit-slices selected of them.

As another option, losses associated with at least some of the infinite portions of the netlist may be removed. For example, such losses may include losses due to truncation, losses due to sign mismatch, etc. In this way, a larger portion of the netlist may be reasoned using word-level decision procedures (e.g. by providing a description of the losses to the word-level decision procedure). Just by way of example, infinite portions of the netlist may be enlarged by transforming loss regions markers associated with the infinite portions into associated word-level constructs.

In one embodiment, a query to be made to the word-level decision procedure may be modified. Modifying the query may include changing the query to a predetermined format. For example, the predetermined format may include a format capable of being read by the word-level decision procedure. Table 5 shows one example of an algorithm that may be used to modify the query. Of course, it should be noted that such algorithm is set forth for illustrative purposes only, and thus should not be construed as limiting in any manner.

TABLE 5 w = max(w1, w2)
//where w1 and w2 are the widths of a and b, respectively
(a−b)%w == 0
//put information content bounds on the inputs of the islands
//where % is modeled as:
//ASSERT z = dz * D + r
//ASSERT r >=0
//ASSERT r < D In another embodiment, sign mismatch based losses may be removed. The sign mismatch based losses may include losses resulting from sign differences between an input signal and an associated output signal. Table 6 shows an exemplary algorithm for removing a signed mismatch based loss resulting from a signed input signal being extended into an unsigned output signal. Again, it should be noted that such algorithm is set forth for illustrative purposes only, and thus should not be as limiting in any manner.

TABLE 6 x: (n, s)
//where x is the input signal, n is the width of x, and s indicates that
//x is signed
y: (n+d, u), d>=0
//where y is the output signal, d is the difference (delta) between
//the width of x and the width of y, and u indicates that y is unsigned
x -- (TC) -- y
//where TC is the type conversion operator
//to remove the loss between x and y
y = (x >= 0)?x : (x + $2^{\{n+d\}}$)
//if x >= 0, then y = x; else add $2^{\{n+d\}}$ to x to calculate y Table 7 shows an exemplary algorithm for removing a signed mismatch based loss resulting from an unsigned input signal being extended into a signed output signal. Yet again, it should be noted that such algorithm is set forth for illustrative purposes only, and thus should not be as limiting in any manner.

TABLE 7 x: (n, u)
//where x is the input signal, n is the width of x, and u indicates
that x is unsigned
y: (n, s)
//where y is the output signal, n is the width of y such that x and y
are the same width, and s indicates that y is signed
x -- (TC) -- y
//to remove the loss between x and y
y = (x < $2^{\{n-1\}}$)?x : (x−$2^n$)
if x < $2^{\{n-1\}}$, then y = x; else subtract $2^n$ from x to calculate y Optionally, losses associated with an input signal x: (n,u) and an output signal y: (n+d, s), where d>0 may not necessarily be removed. Accordingly, if the output signal (y) is signed and its width (n) is greater than the width of the unsigned input signal (x), losses associated therewith may not necessarily be removed.

In yet another embodiment, truncation based losses may be removed. The truncation based losses may include losses resulting from an output signal being narrow (i.e. having a smaller width) than an associated input signal. Table 8 shows an exemplary algorithm for removing a truncation based loss. Again, it should be noted that such algorithm is set forth for illustrative purposes only, and thus should not be as limiting in any manner.

TABLE 8 a) x: (n, t)
//where x is the input signal, n is the width of x, and t indicates that
//x may be signed or unsigned
y: (n−d, t), d > 0
//where y is the output signal, n is the width of x, d is the difference
//between the width of x and the width of y, and t indicates that y
//may be signed or unsigned
//Let x: IC be [l, u], let spread = # of bits needed to represent
// the # of values in the range [l, u];
// where IC = information content that x carries, l is the lower
//bound and u is the upper bound
  if (spread <= n−d) then you can transform, in certain cases,
  x to x':(n−d, t), where
  x'= x − offset
//offset and the signedness of x' t are computed as follows:
  1) offset = l div $2^{\{n-d\}}$
    //where div denotes integer division.
    l' = l − offset, u' = u − offset
    This ensures that 0 <= l' <= u' < 2*$2^{\{n-d\}}$
    Due to the condition on the spread, and l <= u.

TABLE 8-continued

If (u' < $2^{\{n-d\}}$), then
  the transformation to x' can be done, with
    the new type being unsigned, and the offset being l div $2^{\{n-d\}}$
  else
    go to step 2.
2) offset = l div $2^{\{n-d\}}$ + $2^{\{n-d\}}$
  l' = l − offset, u' = u − offset
  Due to the condition on the spread,
  we'll have $-2^{\{n-d-1\}}$ <= l' <= u' < $3.2^{\{n-d-1\}}$
  If we also satisfy
    $-2^{\{n-d-1\}}$ <= l' and u' < $2^{\{n-d-1\}}$
    then new type is signed, and the offset is l div $2^{\{n-d\}}$ + $2^{\{n-d\}}$
  else
    the applicable one of steps b-e (selected based on a type of the
input signal and a type of the output signal) need to be carried out (i.e. if
the offset cannot be determined according to 1) or 2) above.
//if the offset is obtained, remove any sign mismatch based losses
  //Note that transformations b-e can make the word-level decision
procedure queries more difficult to prove, so such transformations can be
optionally dropped, and the truncation based losses that b-e treat be left as
they are.
  b) x: (n, u)
    y: (n−d, u), d > 0
    x -- (TC) -- y
//where TC is the type conversion operator
  is
    y = x%$2^{\{n-d\}}$
// where % is modeled as described in Table 5.
  c) x: (n, s)
    y: (n−d, u), d' > 0
    x -- (TC) -- y
//where TC is the type conversion operator
  is
    x -- (TC) -- x':(n, u)
    x' -- (TC) -- y
//where TC is the type conversion operator
  // Then remove the sign mismatch based loss (e.g. as in Table 6) and
perform b) shown above.
  d) x: (n, u)
    y: (n−d, s), d > 0
    x -- (TC) -- y
//where TC is the type conversion operator
  is
    x -- (TC) -- x':(n−d, u)
    x' -- (TC) -- y
//where TC is the type conversion operator
  //Then perform b) shown above and remove the sign mismatch based
loss (e.g. as in Table 7)
  e) x: (n, s)
    y: (n−d, s), d > 0
    x -- (TC) -- y
//where TC is the type conversion operator
  is
    x -- (TC) -- x':(n, u)
    x' -- (TC) -- y':(n−d, u)
    y' -- (TC) -- y
//where TC is the type conversion operator
  Then remove the sign mismatch based loss (e.g. as in Table 6),
perform b) described above, and remove the sign mismatch based loss
(e.g. as in Table 7)

Moreover, as shown in operation 208, the netlist is compared with another netlist. The other netlist may include a netlist predetermined to be functionally valid, in one embodiment. With respect to the present embodiment, the netlist may be compared with the other netlist, utilizing the finite portions of the netlist included in the finite region. Just by way of example, regions of the other netlist may also be decomposed, such that finite portions of the netlist may be compared with finite portions of the other netlist.

As also shown, it is determined whether the netlist is equivalent to the other netlist. Note decision 210. In one embodiment, it may be determined that the netlist is equivalent to the other netlist if the netlist matches the other netlist. For example, the netlist may be equivalent to the other netlist if the finite portions of the netlist match the finite portions of the other netlist.

If it is determined that the netlist and the other netlist are equivalent, a match is reported. Note operation 212. The match may optionally be reported to a user from which the netlist is received. Of course, however, the match may be reported in any desired manner. As another option, the match may be reported for indicating that the netlist is functionally valid.

If it is determined that the netlist and the other netlist are not equivalent, an abstraction is performed. Note operation 214. Thus, the abstraction may be conditionally performed based on the determination as to whether the netlist is equivalent to the other netlist. Determining that the netlist and the other netlist are not equivalent may include determining that is it unknown whether the netlist and the other netlist are equivalent. Thus, further processing via the abstraction may be performed for determining whether the netlist and the other netlist are equivalent, as described below.

The abstraction may include any abstraction capable of being performed on the netlist. In one embodiment, the abstraction may replace predetermined types of operators in the netlist with simpler operators. For example, complex (hard) arithmetic operators, such as a multiplier, dividers, etc. may be replaced with simple operator(s), which is equivalent to the complex operators in the context of the equivalency query. As an option, the most common type of abstraction may be that of replacing hard operators with a partially interpreted operator. For example, using interval arithmetic, one can determine the range of values possible at the output of these operators and replace them by an uninterpreted function with the range. Next, the operator may be interpreted only for a few values in the input domain (e.g. a multiplier that accurately multiplies only the extreme values on the input ranges, and otherwise is an uninterpreted function in the output range.

In another embodiment, the abstraction may remove a control portion of the netlist. Such control portion may include a portion of the netlist that an algorithm for solving an infinite equation may be incapable of solving. In one embodiment, the control portions may be solved utilizing the SMT solver, such as CVC.

In addition, as shown in operation 216, the netlist is compared with the other netlist. With respect to the present embodiment, the comparison may include comparing the abstraction of the netlist with the other netlist. It is further determined whether the netlist and the other netlist are equivalent, as shown in decision 218. For example, it may be determined that the netlist and the other netlist are equivalent if it is determined that the netlist matches the other netlist, based on the comparison.

If it is determined that the netlist and the other netlist are equivalent, a match is reported. Note operation 212. If, however, it is determined that the netlist and the other netlist are not equivalent, a partial comparison is performed. Note operation 220.

Determining that the netlist and the other netlist are not equivalent may include determining that is it unknown whether the netlist and the other netlist are equivalent. Thus, further processing via the partial comparison may be performed, as described below. To this end, the partial equivalence may conditionally be determined based on the determination of whether the netlist is equivalent to the other netlist.

In one embodiment, the partial equivalence may be determined for the netlist and the other netlist. In another embodiment, the partial equivalence may be determined utilizing the finite portions of the netlist. Such finite portions may include the abstraction of the finite portions, as an option.

Still yet, the partial equivalence may include determining whether any subpart of the netlist (e.g. operators, etc.) is equivalent to any subpart of the other netlist. For example, it may be determined whether any subpart of the finite portion of the netlist is equivalent to any subpart of the finite portion of the other netlist. In this way, matches between subparts of the netlist and the other netlist may be determined by performing the partial equivalence.

Moreover, results of the partial equivalence are sent to a downstream process, as shown in operation 222. The results may indicate whether at least one subpart of the netlist is equivalent to at least one subpart of the other netlist. As an option, the results may indicate for each subpart of the netlist whether an equivalency with a subpart of the other netlist has been identified.

With respect to the present embodiment, the downstream process may include any process utilized for performing a subsequent analysis on the results of the partial equivalence. Thus, the partial equivalence may be used for the subsequent analysis. In one embodiment, the subsequent analysis may include a bit-level analysis. Such bit level analysis may optionally be utilized for determining whether the netlist is equivalent to the other netlist.

Figure 3:
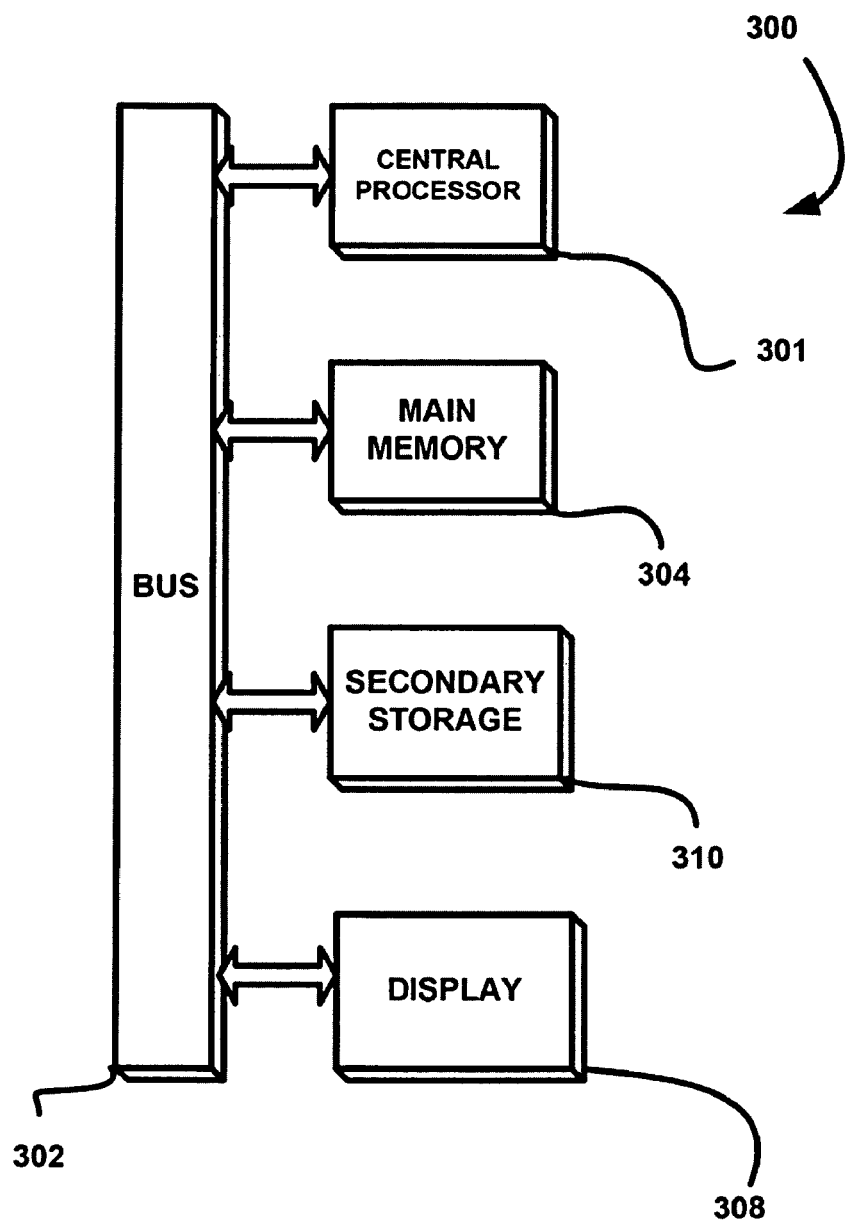
FIG. 3 illustrates an exemplary system, in accordance with one embodiment.

FIG. 3 illustrates an exemplary system 300 with which the various features of FIGS. 1 and/or 2 may be implemented, in accordance with one embodiment. Of course, the system 300 may be implemented in any desired environment.

As shown, a system 300 is provided including at least one central processor 301 which is connected to a communication bus 302. The system 300 also includes main memory 304 [e.g. random access memory (RAM), etc.]. The system 300 also includes a display 308.

The system 300 may also include a secondary storage 310. The secondary storage 310 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 304 and/or the secondary storage 310. Such computer programs, when executed, enable the system 300 to perform various functions. Memory 304, storage 310 and/or any other storage are possible examples of computer-readable media.

In one embodiment, such computer programs may be used to carry out the functionality of the previous figures. Further, in other embodiments, the architecture and/or functionality of the various previous figures may be implemented utilizing the host processor 301, a chipset (i.e. a group of integrated circuits designed to work and sold as a unit for performing related functions, etc.), and/or any other integrated circuit for that matter.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer program product embodied on a tangible computer readable medium, comprising:
    computer code for identifying a netlist including a plurality of infinite portions and a plurality of finite portions;
    computer code for transforming at least some of the plurality of finite portions, utilizing at least one predetermined transformation, where the transforming normalizes at least some of the plurality of finite portions and extracts a word-level intent of the netlist;
    computer code for determining an equivalence of the netlist and another netlist, utilizing at least a subset of the finite portions and the infinite portions; and
    computer code for performing an abstraction on the netlist, where performing the abstraction includes one or more of replacing predetermined types of operators in the netlist and removing a control portion of the netlist;
    wherein the plurality of infinite portions include portions of the netlist that are reasoned in infinite precision, such that unbounded integers are utilized for determining an equivalence of the infinite portions with other infinite portions of the other netlist;
    wherein the plurality of finite portions include portions of the netlist that are reasoned in finite precision, such that finite precision arithmetic is utilized for determining an equivalence of the finite portions with other finite portions of the other netlist;
    wherein the plurality of infinite portions include one or more of lossless regions of the netlist and at least one infinite operator;
    wherein the plurality of finite portions include one or more of lossy regions of the netlist and at least one finite operator.

2. The computer program product of claim 1, wherein the finite portions include at least one finite precision operator, and the infinite portions include at least one infinite precision operator.

3. The computer program product of claim 1, wherein the transformation identifies a word-level functionality of the at least some of the finite portions by converting bit-level functionality into word-level functionality.

4. The computer program product of claim 3, wherein the transformation is utilized within an iteration loop.

5. The computer program product of claim 1, wherein the predetermined transformation reduces a number of bits allocated to an operator, based on information content at various points in the netlist.

6. The computer program product of claim 5, wherein the number of bits is reduced, based on a required precision at various points in the netlist.

7. The computer program product of claim 1, and further comprising computer code for determining a partial equivalence of the netlist and the other netlist, utilizing the finite portions.

8. The computer program product of claim 7, wherein the partial equivalence is conditionally determined based on the determination as to whether the netlist is equivalent to the other netlist.

9. The computer program product of claim 8, wherein the partial equivalence is determined if the netlist is determined to not be equivalent to the other netlist.

10. The computer program product of claim 7, wherein the partial equivalence is used for subsequent analysis.

11. The computer program product of claim 10, wherein the subsequent analysis includes a bit-level analysis.

12. The computer program product of claim 1, and further comprising removing losses associated with at least some of the infinite portions, the losses including at least truncation based losses.

13. The computer program product of claim 12, wherein removing the losses includes transforming loss regions markers associated with the infinite portions.

14. The computer program product of claim 12, wherein the losses include losses due to sign mismatch.

15. The computer program product of claim 1, wherein the infinite portions are enlarged by transforming loss regions markers associated with the infinite portions into associated word-level constructs.

16. The computer program product of claim 1, wherein the abstraction is conditionally performed based on the determination as to whether the netlist is equivalent to the other netlist.

17. The computer program product of claim 1, wherein the abstraction includes replacing hard arithmetic operators.

18. The computer program product of claim 1, further comprising computer code for decomposing the netlist into a plurality of finite portions and a plurality of infinite portions.

19. The computer program product of claim 1, wherein at least some of the finite portions are transformed into infinite portions, utilizing the at least one predetermined transformation.

20. The computer program product of claim 1, wherein the abstraction replaces predetermined types of operators in the netlist.

21. The computer program product of claim 20, wherein the abstraction includes determining a range of values possible at an output of the operators and replacing them with an uninterpreted function with the range.

22. The computer program product of claim 20, wherein the abstraction includes determining a range of values possible at an output of the operators and replacing them with a partially interpreted function with the range.

23. The computer program product of claim 1, and further comprising removing losses associated with at least some of the infinite portions, the losses including at least sign mismatch based losses.

24. The computer program product of claim 1, wherein the abstraction removes a control portion of the netlist.

25. A computer-implemented method, comprising:
identifying a netlist including a plurality of infinite portions and a plurality of finite portions;
transforming at least some of the plurality of finite portions, utilizing at least one predetermined transformation, where the transforming normalizes at least some of the plurality of finite portions and extracts a word-level intent of the netlist;
determining an equivalence of the netlist and another netlist, utilizing at least a subset of the finite portions and the infinite portions; and
performing an abstraction on the netlist, utilizing a processor, where performing the abstraction includes one or more of replacing predetermined types of operators in the netlist and removing a control portion of the netlist;
wherein the plurality of infinite portions include portions of the netlist that are reasoned in infinite precision, such that unbounded integers are utilized for determining an equivalence of the infinite portions with other infinite portions of the other netlist;
wherein the plurality of finite portions include portions of the netlist that are reasoned in finite precision, such that finite precision arithmetic is utilized for determining an equivalence of the finite portions with other finite portions of the other netlist;
wherein the plurality of infinite portions include one or more of lossless regions of the netlist and at least one infinite operator;
wherein the plurality of finite portions include one or more of lossy regions of the netlist and at least one finite operator.

26. A system, comprising:
a processor for transforming finite portions of a netlist utilizing at least one predetermined transformation for determining an equivalence of the netlist and another netlist, utilizing at least a subset of the finite portions and infinite portions of the netlist, and performing an abstraction on the netlist, where performing the abstraction includes one or more of replacing predetermined types of operators in the netlist and removing a control portion of the netlist;
wherein the transforming normalizes at least some of the plurality of finite portions and extracts a word-level intent of the netlist;
wherein the infinite portions include portions of the netlist that are reasoned in infinite precision, such that unbounded integers are utilized for determining an equivalence of the infinite portions with other infinite portions of the other netlist;
wherein the finite portions include portions of the netlist that are reasoned in finite precision, such that finite precision arithmetic is utilized for determining an equivalence of the finite portions with other finite portions of the other netlist;
wherein the plurality of infinite portions include one or more of lossless regions of the netlist and at least one infinite operator;
wherein the plurality of finite portions include one or more of lossy regions of the netlist and at least one finite operator.

27. The system of claim 26, wherein the processor remains in communication with memory via a bus.

* * * * *